US009209821B2

(12) United States Patent
Bichan et al.

(10) Patent No.: US 9,209,821 B2
(45) Date of Patent: Dec. 8, 2015

(54) APPARATUS FOR GENERATING QUADRATURE CLOCK PHASES FROM A SINGLE-ENDED ODD-STAGE RING OSCILLATOR

(71) Applicants: Michael E. Bichan, Toronto (CA); Jonathan E. Rogers, Toronto (CA)

(72) Inventors: Michael E. Bichan, Toronto (CA); Jonathan E. Rogers, Toronto (CA)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 14/163,746

(22) Filed: Jan. 24, 2014

(65) Prior Publication Data

US 2015/0214967 A1 Jul. 30, 2015

(51) Int. Cl.
*H03L 7/081* (2006.01)
*H03L 7/099* (2006.01)
*H04L 7/00* (2006.01)
*H04L 7/033* (2006.01)

(52) U.S. Cl.
CPC .......... *H03L 7/0998* (2013.01); *H04L 7/0025* (2013.01); *H04L 7/0334* (2013.01)

(58) Field of Classification Search
CPC ............. H03L 7/00; H03L 7/06; H03L 7/07; H03L 7/08; H03L 7/081; H03L 7/0812; H03L 7/0814; H03L 7/0816; H03L 7/0818; H03L 7/083; H03L 7/0995; H03L 7/0996; H03L 7/0997; H03L 7/0998
USPC ......... 375/295, 316, 354, 362, 371, 373, 375, 375/376
See application file for complete search history.

(56) References Cited

U.S. PATENT DOCUMENTS 5,442,325 A  8/1995  Bosshart
5,502,418 A  3/1996  Arai
5,563,554 A  10/1996  Mizuno
5,767,748 A  6/1998  Nakao
6,009,534 A  12/1999  Chiu et al.
8,432,203 B2  4/2013  Pialis et al.
8,710,929 B1*  4/2014  Naviasky et al. .............. 331/57
2002/0075087 A1  6/2002  Talbot
2002/0125960 A1*  9/2002  Pickering ..................... 331/25
2003/0034849 A1  2/2003  Sanduleanu
2006/0001496 A1  1/2006  Abrosimov et al.
2007/0160173 A1*  7/2007  Takeuchi ..................... 375/355
2009/0031278 A1*  1/2009  McElvain et al. ............ 716/18
2013/0099871 A1  4/2013  Wang
2013/0191679 A1*  7/2013  Zhuang et al. ............... 713/503
2013/0278344 A1*  10/2013  Ding ............................ 331/45
2014/0210562 A1*  7/2014  Tu ................................ 331/57
2014/0241442 A1*  8/2014  Ahmadi et al. ............... 375/259
2015/0032835 A1*  1/2015  Sharp et al. .................. 709/212

FOREIGN PATENT DOCUMENTS

JP  2006-339871  12/2006
JP  2006339871 A  12/2006

OTHER PUBLICATIONS

PCT Notification of Transmittal of the International Search Report and the Written Opinion for PCT Counterpart Application No. PCT/US2014/071280, 11 pgs., (Apr. 16, 2015).
PCT Notification of Transmittal of the International Search Report and the Written Opinion for PCT Counterpart Application No. PCT/US2014/061384, 11 pgs., (Jan. 13, 2015).
PCT Appln. No. PCT/US2014/071280 International Search Report and Written Opinion, Apr. 16, 2015, 11 pgs.

* cited by examiner

*Primary Examiner* — Siu Lee
(74) *Attorney, Agent, or Firm* — Blakely, Sokoloff, Taylor & Zafman LLP

(57) ABSTRACT

Described is an apparatus which comprises: a ring oscillator having odd number of delay stages; and an interpolator to receive at least three phases from the ring oscillator, the interpolator to generate quadrature clock phases by interpolating the at least four phases.

20 Claims, 4 Drawing Sheets

APPARATUS FOR GENERATING QUADRATURE CLOCK PHASES FROM A SINGLE-ENDED ODD-STAGE RING OSCILLATOR

BACKGROUND

Quadrature phases are used in many circuits. For example, quadrature phases are used for clock-and-data recovery (CDR) and clock synthesis. The term "Quadrature phases" here generally refers to four periodic signals each having a different phase separated from the other phase by 90°. For example, quadrature phases are periodic signals with phases of 0° (or 360°), 90°, 180°, and 270°. Known solutions to generate quadrature phases use a four-stage differential ring oscillator which generates quadrature phases naturally. However, differential ring oscillators may be larger in size and may consume more power than single-ended ring oscillators. Also, a four stage ring oscillator is generally slower than a three stage ring oscillator.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
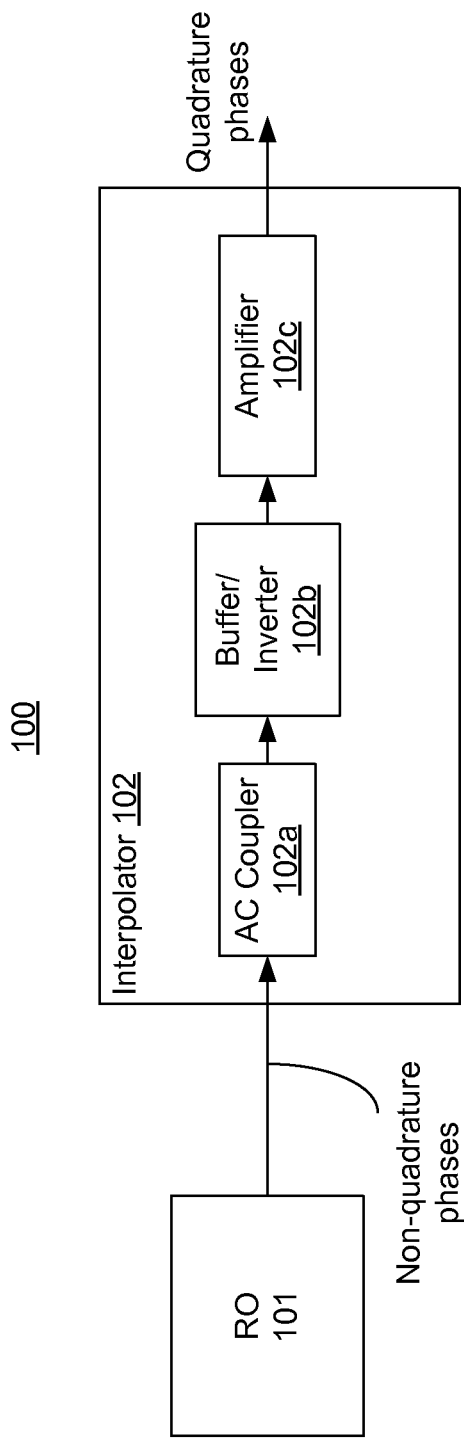
FIG. 1 illustrates a high-level circuit for generating quadrature clock phases, according to one embodiment of the disclosure.

The embodiments describe an apparatus which comprises a single-ended ring oscillator (RO) having odd number of single-ended delay stages coupled together to form a ring. In one embodiment, the single-ended RO (e.g., a three stage RO) provides at least four phases (e.g., 0°, 120°, 240°, 360°). A person skilled in the art would know that phase 360° and phase 0° are the same phases, and so the at least four phases can be interpreted as at least three unique phases. In one embodiment, the apparatus further comprises an interpolator to receive at least three phases from the single-ended RO to generate quadrature clock phases (0°, 90°, 180°, 270°) by interpolating the at least three unique phases. While the embodiments are explained with reference to a three stage RO, it is applicable to any odd stage RO.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of in includes in and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
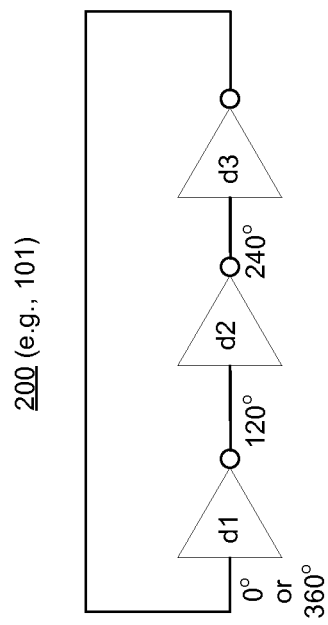
FIG. 2 illustrates a single-ended ring oscillator for providing input to the circuit of FIG. 1, according to one embodiment of the disclosure.

FIG. 1 illustrates a high-level circuit 100 for generating quadrature clock phases, according to one embodiment of the disclosure. In one embodiment, circuit 100 comprises RO 101 and interpolator 102. In one embodiment, RO 101 includes an odd number of delay stages coupled together to form a ring. One example of RO 101 is shown in FIG. 2. FIG. 2 illustrates a single-ended three-stage RO 200 for providing input to interpolator 102, according to one embodiment of the disclosure. Here, RO 200 provides four non-quadrature phases (or at least three unique phases)—e.g., 0°, 120°, 240°, 360° (which is same as 0°). While the embodiments are explained with reference to a three stage RO, a RO with any number of odd delay stages may be used.

Referring back to FIG. 1, in one embodiment, interpolator 102 receives the non-quadrature phases (e.g., 0°, 120°, 240°, 360°) from RO 101 and generates quadrature phases i.e., 0°, 90°, 180°, 270°. RO 101 may be a voltage controlled RO (VCO), a digitally controlled RO (DCO), a combination of both, or other types of ROs. In one embodiment, interpolator 102 comprises an AC (alternating current) coupler 102a (also referred to as the AC coupling interpolating stage), Buffer or Inverter 102b (also referred to as the Buffer or Inverter interpolating stage), and Amplifier 102c.

In one embodiment, AC coupling interpolating stage 102a (which is the first interpolating stage) combines 0°, 120°, and 240° phases from RO 101 by AC coupling to generate 60°, 180°, and 300° phases. These new phases (i.e., 60°, 180°, and) 300° may have unequal amplitudes and/or amplitudes different from those of the original input phases 0°, 120°, and 240° from RO 101. In one embodiment, Buffer or Inverter interpolating stage 102b (which is the second interpolating stage) combines the six phases (which are 60° apart) using threshold-biased inverters to generate the quadrature phases i.e., 0°, 90°, 180°, and 270°. These new phases (i.e., 0°, 90°, 180°, and 270°) may also have unequal amplitudes. In one embodiment, the quadrature phases from Buffer or Inverter interpolating stage 102b are amplified using single-ended CMOS inverters and cross-coupled inverters. In such an embodiment, rise and fall times (or slopes) of quadrature phases i.e., 0°, 90°, 180°, and 270° are improved to generate the quadrature phases i.e., 0°, 90°, 180°, and 270°, for use by downstream logic.

Figure 3:
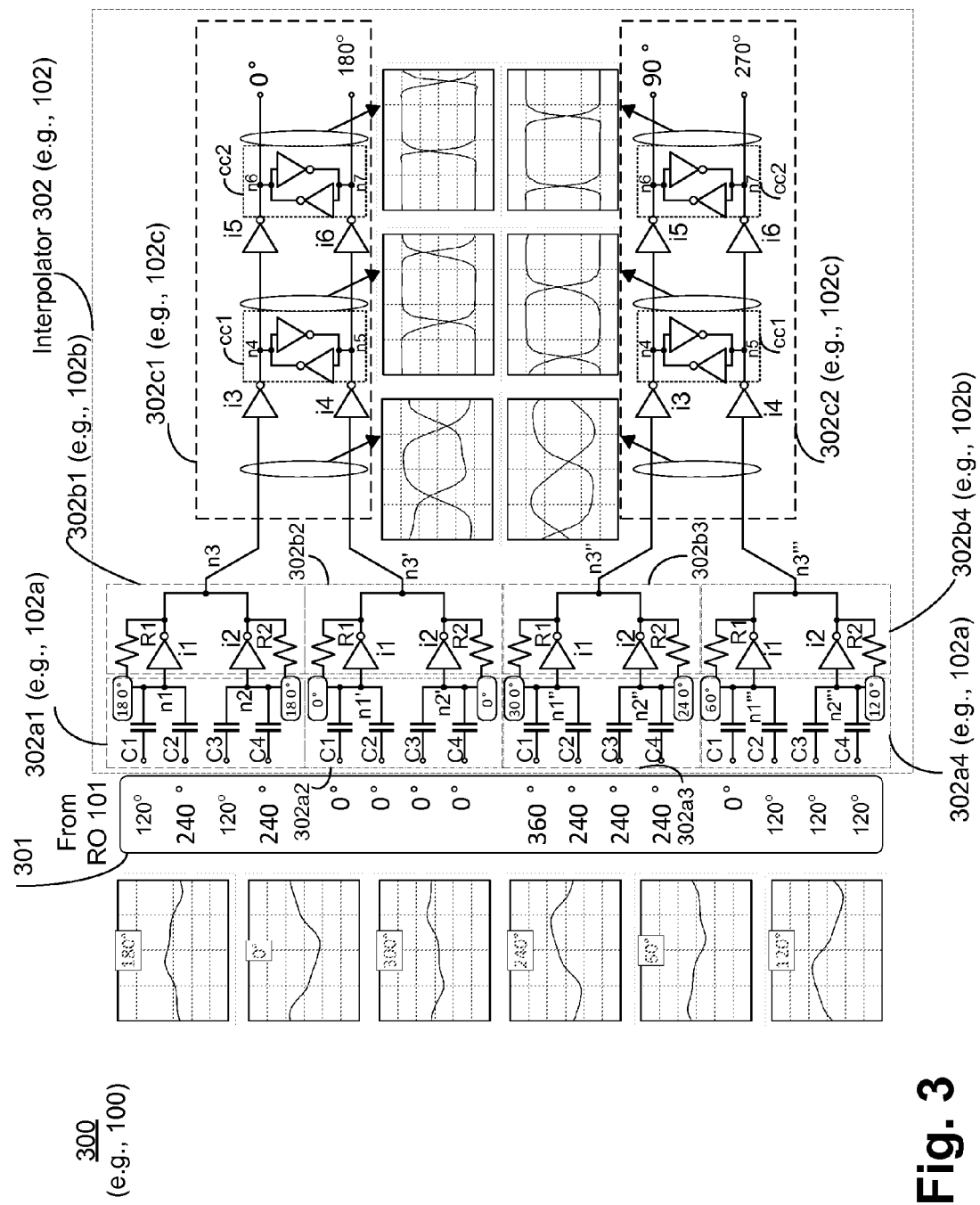
FIG. 3 illustrates a circuit showing implementation of the high-level circuit of FIG. 1, according to one embodiment of the disclosure.

FIG. 3 illustrates a circuit 300 showing implementation of the high-level circuit of FIG. 1, according to one embodiment of the disclosure. It is pointed out that those elements of FIG. 3 having the same reference numbers (or names) as the elements of any other figure can operate or function in any manner similar to that described, but are not limited to such.

In one embodiment, non-quadrature phases 301 are received from RO 101 to be provided as input to interpolator 302 (e.g., 102). In one embodiment, interpolator 302 comprises four sets of AC coupling stages 302a1 to 301a4 (i.e., 102a), and four sets of Buffer/Inverter interpolating stages 302b1 to 302b2 (i.e., 102b). The AC coupling stages are also referred as the first interpolating stages while the Buffer/Inverter interpolating stages are also referred to the second interpolating stages. So as not to obscure the embodiments, first (i.e., 302a1) of the four sets of first interpolating stages is discussed in detail. The same explanation is relevant to other sets of the first interpolating stages.

In one embodiment, the first set of the first interpolating stage 302a1 (e.g., part of 102a) comprises two pairs of capacitors. In one embodiment, the first pair of capacitors C1 and C2 receives at their respective first terminals two of the at least three non-quadrature phases from RO 101. In such an embodiment, the respective second terminals of the first pair of capacitors C1 and C2 are electrically shorted at node n1. In one embodiment, the second pair of capacitors C3 and C4 receives at their respective first terminals two of the at least three non-quadrature phases from RO 101. In such an embodiment, the respective second terminals of the second pair of capacitors C3 and C4 are electrically shorted at node n2. The nodes n1 and n2 provide the first interpolation of the non-quadrature phases.

For a three stage RO 101, the first terminal of capacitor C1 receives phase 120° from RO 101, the first terminal of capacitor C2 receives phase 240° from RO 101, the first terminal of capacitor C3 receives phase 120° from RO 101, and the first terminal of capacitor C4 receives phase 240° from RO 101. At node n1, phase 180° is generated by interpolating (via AC coupling) of phases 120° and 240°. At node n2, phase 180° is generated by interpolating (via AC coupling) of phases 120° and 240°.

In one embodiment, the second interpolating stage comprises four sets of second interpolating stages 302b1 to 302b4. So as not to obscure the embodiments, first (i.e., 302b1) of the four sets of second interpolating stages is discussed in detail. The same explanation is relevant to other sets (i.e., 302b2, 302b3, and 302b4) of the second interpolating stages.

In one embodiment, first set of the second interpolating stage 302b1 (e.g., part of 102b) comprises a pair of inverters and/or buffers. In one embodiment, the first inverter i1 has an input terminal coupled to node n1 and an output terminal coupled to node n3. In one embodiment, second set of interpolating stage 302b1 further comprises a resistor R1 coupling nodes n3 to n1. In one embodiment, resistor R1 provides resistive feedback to inverter i1 to maintain an input common-mode voltage at the threshold of the inverter i1. In one embodiment, the second inverter i2 has an input terminal coupled to node n2 and an output terminal coupled to node n3. In such an embodiment, outputs of inverters i1 and i2 are electrically shorted at node n3.

In one embodiment, first set of the second interpolating stage 302b1 further comprises a resistor R2 coupling node n3 to node n2. In one embodiment, resistor R2 provides resistive feedback to inverter i2 to maintain an input common-mode voltage at the threshold of the inverter i2. In one embodiment, resistors R1 and R2 are implemented as precision resistors (e.g., CPR). In one embodiment, resistors R1 and R2 are implemented with transistors operating in linear region. In one embodiment, resistors R1 and R2 have programmable resistances. For example, resistances of resistors R1 and R2 can be programmed digitally or using fuse signals. In one embodiment, resistors R1 and R2 have resistances of 60 KOhms respectively. In other embodiments, other values for resistances may be used. The overall effect of the first sets of first and second interpolating stages (i.e., 302a1 and 302b1) is to produce a clock with phase inverse to the average of the input clock phases. In this example, phases of 180° on nodes n1 and n2 are inverted by inverters i1 and i2 to produce phase 0° on node n3.

In one embodiment, interpolator 302 further comprises an amplifying stage having first and second portions 302c1 and 302c2. So as not to obscure the embodiments, first portion 302c1 of amplifying stage is discussed in detail. The same explanation is valid for amplifying stage portion 302c2. In one embodiment, first portion of amplifying stage 302c1 comprises inverters i3, i4, i5, and i6, and cross-coupled inverters cc1 and cc2 coupled together as shown. In one embodiment, input of inverter i3 is coupled to node n3 of the second interpolating stage 302b1 of the first set of interpolators. In one embodiment, input of inverter i4 is coupled to node n3' of the second interpolating stage 302b2 of the second set of interpolators. In this example, node n3 provides the 0° phase of the quadrature phases while node n3' provides the 180° phase of the quadrature phases.

For a three-stage RO 101, the first terminals of capacitors C1, C2, C3, and C4 of second set of first interpolating stage 302a2 receives phase 0° from RO 101. At node n1', phase 0° is generated by interpolating (via AC coupling) of phases 0° and 0°. At node n2', phase 0° is generated by interpolating (via AC coupling) of phases 0° and 0°. In this example, phases of 0° on nodes n1' and n2' are inverted by inverters i1 and i2 to produce phase 180° on node n3'.

Continuing with the three-stage RO 101 example, the first terminal of capacitor C1 of 302a3 receives phase 360° from RO 101, the first terminal of capacitor C2 of 302a3 receives phase 240° from RO 101, the first terminal of capacitor C3 of 302a3 receives phase 240° from RO 101, and the first terminal of capacitor C4 of third set of first interpolating stage 302a3 receives phase 240° from RO 101. At node n1″, phase 300° is generated by interpolating (via AC coupling) of phases 360° and 240°. At node n2″, phase 240° is generated by interpolating (via AC coupling) of phases 240° and 240°.

Here, the first terminal of capacitor C1 of fourth set of first interpolating stage 302a4 receives phase 0° from RO 101, while the first terminals of capacitors C2 to C4 of 302a4 receive phase 120° from RO 101. At node n1‴, phase 60° is generated by interpolating (via AC coupling) of phases 0° and 120°. At node n2‴, phase 120° is generated by interpolating (via AC coupling) of phases 120° and 120°. In this example, node n3″ provides the 90° phase of the quadrature phases while node n3‴ provides the 270° phase of the quadrature phases.

In one embodiment, capacitors C1 to C4 of the four sets of first interpolating stages are implemented as metal capacitors. In one embodiment, capacitors C1 to C4 of the four sets of first interpolating stages are implemented as a combination of transistors and metal capacitors i.e., hybrid capacitors. In one embodiment, capacitors C1 to C4 of the four sets of first interpolating stages are implemented as transistor capacitors. In one embodiment, capacitances of capacitors C1 to C4 can be adjusted digitally or by using fuse signals. In one embodiment, capacitances of capacitors C1 to C4 are 15 fF respectively. In other embodiments, other values for capacitances may be used.

In one embodiment, inverters i3, i4, i5, and i6, and cross-coupled inverters cc1 and cc2 sharpen the clock edges and ensure that the clocks are differential. In one embodiment, cross-coupled inverter cc1 is coupled to outputs (i.e., nodes n4 and n5) of inverters i3 and i4. In one embodiment, cross-coupled inverter cc2 is coupled to outputs (i.e., nodes n6 and n7) of inverters i5 and i6. The second portion 302c2 provides 90° and 270° of the quadrature phases.

Table 1 shows how to generate quadrature phases using different single-ended ring oscillators having different odd number of delay stages (e.g., 3, 5, 7, and 9).

TABLE 1

Inputs to AC coupling interpolating stage for different ROs

| Output Clock Phase (quadrature phases) | 3-stage RO | 5-stage RO | 7-stage RO | 9-stage RO |
|---|---|---|---|---|
| 0° | 120°, 240°, 120°, 240° | 144°, 216°, 144°, 216° | 154°, 206°, 154°, 206° | 160°, 200°, 160°, 200° |
| 90° | 240°, 240°, 240°, 0° | 216°, 288°, 288°, 288° | 257°, 257°, 257°, 309° | 240°, 240°, 280°, 320° |
| 180° | 0°, 0°, 0°, 0° | 0°, 0°, 0°, 0° | 309°, 51°, 0°, 0° | 320°, 40°, 0°, 0° |
| 270° | 0°, 120°, 120°, 120° | 72°, 72°, 72°, 144° | 51°, 103°, 103°, 103° | 40°, 80°, 120°, 120° |

Here, the phases listed in each column for 3-stage RO, 5-stage RO, 7-stage RO, and 9-stage RO are provided as inputs from the respective ROs to first terminals of capacitors C1, C2, C3, and C4 respectively. For example, for a 5-stage RO, non-quadrature phases of 0°, 72°, 144°, 216°, and 288° are provided to Interpolator 102. To generate 0° phase, first set of first interpolating stage 302a1 receives phase 144° at first terminal of capacitor C1 and phase 216° at first terminal of C2 while first terminal of capacitor C3 receives phase 144° and first terminal of capacitor C4 receives phase 216°. To generate 90° phase, second set of first interpolating stage 302a2 receives phase 216° at first terminal of capacitor C1 while first terminals of capacitors C2, C3, and C4 receive phases 288°. To generate 180° phase, third set of first interpolating stage 302a3 receives phases 0° at first terminals of capacitors C1, C2, C3, and C4. To generate 270° phase, fourth set of first interpolating stage 302a4 receives phases 72° at first terminals of capacitors C1, C2, and C3 while first terminal of capacitor C4 receives phase 144°. Similar inputs to first terminals of capacitors C1 to C4 of first interpolating stages of the four sets can be made for other ROs with odd number stages, some of which are elaborated in Table 1.

Figure 4:
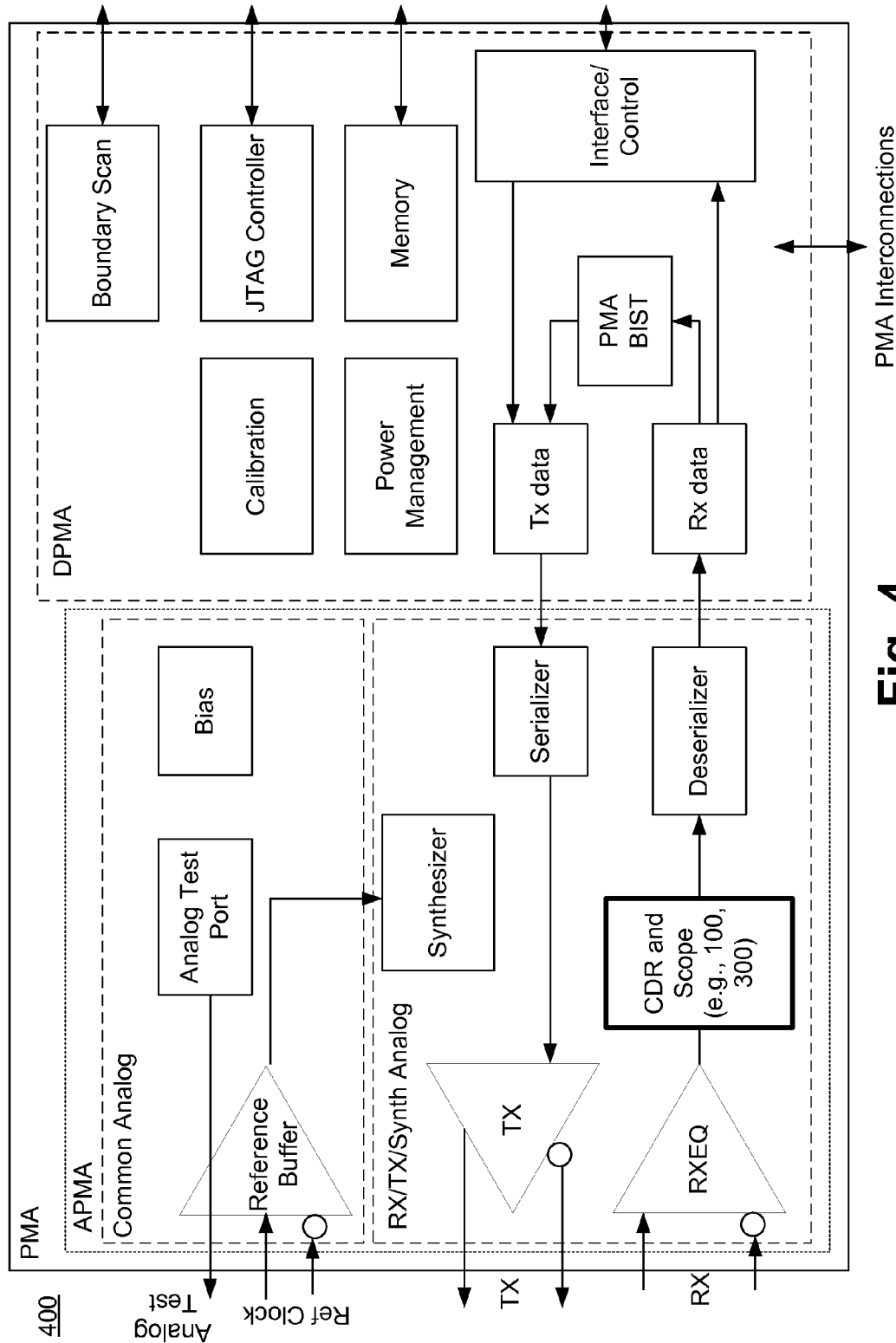
FIG. 4 illustrates a Serializer/Deserializer Architecture using the circuit for generating quadrature clock phases, according to one embodiment of the disclosure.

FIG. 4 illustrates a Serializer/Deserializer Architecture 400 using the circuit (e.g., 100, 300) for generating quadrature clock phases, according to one embodiment of the disclosure. It is pointed out that those elements of FIG. 4 having the same reference numbers (or names) as the elements of any other figure can operate or function in any manner similar to that described, but are not limited to such.

Architecture 400 comprises physical media attachment (PMA) having an analog PMA (APMA) and digital PMA (DPMA). In one embodiment, DPMA is a synthesizable logic block. In one embodiment, in receive (RX) path of APMA, an RX equalizer first compensates the received signal (e.g., a differential signal) for channel loss. In one embodiment, RX equalizer comprises continuous time linear equalizer (CTLE) and a multi-tap (e.g., 5 tap) Decision Feedback Equalizer (DFE). In one embodiment, a half-rate bang-bang style CDR and Scope block recovers timing and slices the equalized signal. In one embodiment, the CDR block includes circuit 100 (and 300) discussed in various embodiments.

In one embodiment, bang-bang timing recovery allows the Serializer/Deserializer to track large PPM (parts per million) frequency offsets between the received signal and local reference clocks, and to track frequency deviations due to spread-spectrum clocking. In one embodiment, Deserializer converts the sliced serial data into a parallel data stream for the standard cell logic domain. In one embodiment, RX path also comprises an on-chip eye monitor to observe the equalized eye at the DFE summing node in a non-destructive way. In one embodiment, the TX (transmit) path of the APMA, the Serializer first converts parallel data into a serial bit stream using a synthesized half-rate clock. In such an embodiment, TX driver equalizes the outgoing signal and launches it into the channel.

In one embodiment, architecture 400 is compliant with PCI-Express (Gen1-3), SATA (Gen1-3), IEEE 10G BASE-KR, OIF 11G-SR, and other standards. Here, PCI-Express refers to Peripheral Component Interconnect Express, SATA refers to Serial Advanced Technology Attachment, IEEE refers to the Institute of Electrical and Electronics Engineers, 10G BASE-KR refers to 10-gigabit Ethernet standard, OIF refers to Optical Internetworking Forum, 11G-SR refers to 11-gigabit short reach optical interface.

In one embodiment, a Reference Buffer receives a reference clock (Ref Clock) from off-chip and translates it to full swing CMOS level for use on-chip. In one embodiment, an Analog Test port allows access to on-chip signals for debugging purposes. In one embodiment, a bias circuit (Bias) provides stable current signals for use by other circuits. In one embodiment, a Synthesizer generates a half-rate clock for use by the Serializer. In one embodiment, a Boundary Scan circuit allows low-speed access to all pins for testing purposes. In one embodiment, a calibration circuit (Calibration) is used to adjust certain voltages of on-chip analog blocks to fine-tune their performance on a chip-by-chip basis.

In one embodiment, a Power Management block ensures that other circuits power on in the correct order, and power off in the correct order. In one embodiment, a JTAG Controller permits low-speed access to off-chip digital signals for the purposes of controlling the Serializer/Deserializer. JTAG refers to Joint Test Action Group which is a common name for IEEE 1149.1 Standard Test Access Port and Boundary-Scan Architecture. In one embodiment, a Memory circuit stores digital bits that are used to control the Serializer/Deserializer. In one embodiment, a TX Data circuit provides data to the Serializer. In one embodiment, an RX data blocks receives data from the Deserializer. In one embodiment, a PMA BIST (built-in self test) circuit allows the Serializer/Deserializer to test itself. In one embodiment, an interface/control circuit mediates access between the Serializer/Deserializer and other components off-chip. In one embodiment, there are PMA interconnections that allow one Serializer/Deserializer to communicate with the other Serializer/Deserializers.

Figure 5:
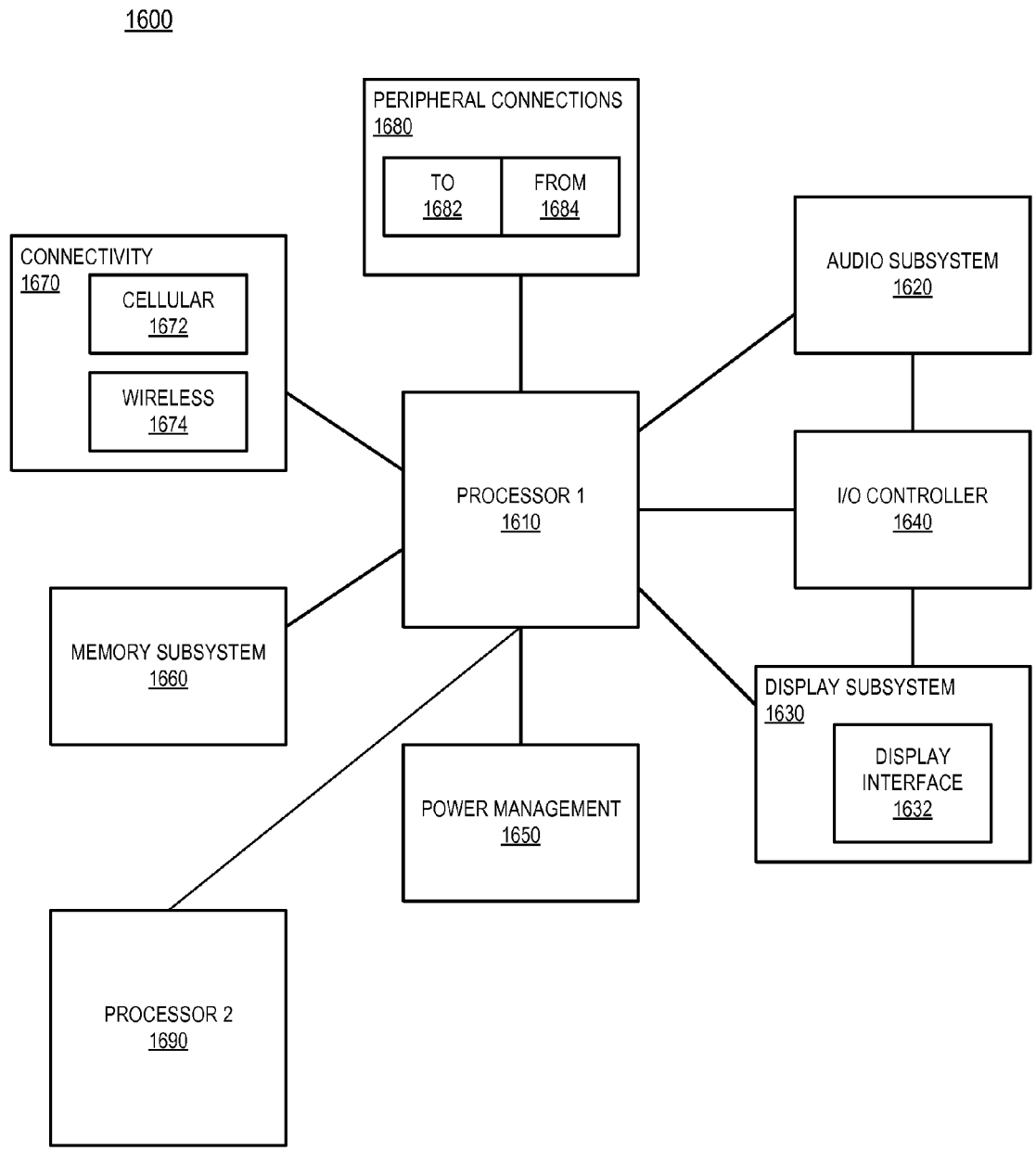
FIG. 5 is a smart device or a computer system or an SoC (System-on-Chip) with apparatus for generating quadrature clock phases, according to one embodiment of the disclosure.

FIG. 5 is a smart device or a computer system or an SoC (System-on-Chip) with apparatus for generating quadrature clock phases, according to one embodiment of the disclosure. It is pointed out that those elements of FIG. 5 having the same reference numbers (or names) as the elements of any other figure can operate or function in any manner similar to that described, but are not limited to such.

FIG. 5 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 apparatus for generating quadrature clock phases described with reference to embodiments. Other blocks of the computing device 1600 may also include apparatus for generating quadrature clock phases described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," "or some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a ring oscillator having odd number of delay stages; and an interpolator to receive at least three phases from the ring oscillator, the interpolator to generate quadrature clock phases by interpolating the at least three phases. In one embodiment, the ring oscillator is a single-ended ring oscillator. In one embodiment, the interpolator comprises an AC coupling interpolating stage for receiving the at least three phases. In one embodiment, the AC coupling interpolating stage comprises a plurality of capacitors. In one embodiment, the interpolator further comprises a buffer or inverting interpolating stage coupled to the AC coupling interpolating stage. In one embodiment, the interpolator further comprises an amplifying stage coupled to the buffer or inverting interpolating stage, the amplifying stage to improve signal strength of the quadrature clock phases. In one embodiment, the amplifying stage comprises cross-coupled inverters.

In another example, a system is provided which comprises: a memory; and a processor coupled to the memory, the processor having an apparatus according to the apparatus discussed above. In one embodiment, the system further comprises a wireless interface for allowing the processor to communicatively couple to another device. In one embodiment, the system further comprises a display unit. In one embodiment, the display unit is a touch screen.

In another example, an apparatus is provided which comprises: a receiver to receive a differential signal; and a clock data recovery (CDR) circuit coupled to the receiver, the CDR circuit comprising: a ring oscillator having odd number of delay stages; and an interpolator to receive at least three phases from the ring oscillator, the interpolator to generate quadrature clock phases by interpolating the at least three phases, wherein the quadrature clock phases for recovering data from the differential signal.

In one embodiment, the ring oscillator is a single-ended ring oscillator. In one embodiment, the interpolator comprises: four AC coupling interpolating stages, each AC coupling interpolating stage for receiving some of the at least three phases; and four buffer or inverting interpolating stages, each buffer or inverting interpolating stage coupled to one of the AC coupling interpolating stages. In one embodiment, each of the four AC coupling stages comprises first and second pairs of capacitors, wherein the first pair of capacitors to receive two of the at least three phases at their respective first ends, and wherein respective second ends of the first pair of capacitors are electrically shorted.

In one embodiment, the second pair of capacitors to receive to receive two of the at least three phases at their respective first ends, and wherein respective second ends of the second pair of capacitors are electrically shorted. In one embodiment, each of the four buffer or inverting interpolating stages comprises first and second buffers or inverters, and wherein the first buffer or inverter having an input coupled to the respective second ends of the first pair of capacitors. In one embodiment, the second buffer or inverter having an input coupled to the respective second ends of the second pair of capacitors. In one embodiment, respective outputs of the first and second buffers or inverters are electrically shorted. In one embodiment, the interpolator further comprises an amplifying stage coupled to the respective outputs of the first and second buffers or inverters, the amplifying stage having cross-coupled inverters.

In another example, a system is provided which comprises: a memory; and a processor coupled to the memory, the processor having an apparatus according to the apparatus discussed above. In one embodiment, the system further comprises a wireless interface for allowing the processor to communicatively couple to another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a ring oscillator having odd number of delay stages to generate at least three non-quadrature phases; and
    an interpolator to receive the at least three non-quadrature phases from the ring oscillator, the interpolator to generate quadrature clock phases by interpolating the at least three non-quadrature phases.

2. The apparatus of claim 1, wherein the ring oscillator is a single-ended ring oscillator.

3. The apparatus of claim 1, wherein the interpolator comprises an AC coupling interpolating stage for receiving the at least three phases.

4. The apparatus of claim 3, wherein the AC coupling interpolating stage comprises a plurality of capacitors.

5. The apparatus of claim 3, wherein the interpolator further comprises a buffer or inverting interpolating stage coupled to the AC coupling interpolating stage.

6. The apparatus of claim 5, wherein the interpolator further comprises an amplifying stage coupled to the buffer or inverting interpolating stage, the amplifying stage to improve signal strength of the quadrature clock phases.

7. The apparatus of claim 6, wherein the amplifying stage comprises cross-coupled inverters.

8. An apparatus comprising:
    a receiver to receive a differential signal; and
    a clock data recovery (CDR) circuit coupled to the receiver, the CDR circuit comprising:
        a ring oscillator having odd number of delay stages to generate at least three non-quadrature phases; and
        an interpolator to receive the at least three non-quadrature phases from the ring oscillator, the interpolator to generate quadrature clock phases by interpolating the at least three non-quadrature phases, wherein the quadrature clock phases for recovering data from the differential signal.

9. The apparatus of claim 8, wherein the ring oscillator is a single-ended ring oscillator.

10. The apparatus of claim 9, wherein the interpolator comprises:
    four AC coupling interpolating stages, each AC coupling interpolating stage for receiving some of the at least three phases; and
    four buffer or inverting interpolating stages, each buffer or inverting interpolating stage coupled to one of the AC coupling interpolating stages.

11. The apparatus of claim 10, wherein each of the four AC coupling stages comprises first and second pairs of capacitors, wherein the first pair of capacitors to receive two of the at least three phases at their respective first ends, and wherein respective second ends of the first pair of capacitors are electrically shorted.

12. The apparatus of claim 11, wherein the second pair of capacitors to receive to receive two of the at least three phases at their respective first ends, and wherein respective second ends of the second pair of capacitors are electrically shorted.

13. The apparatus of claim 12, wherein each of the four buffer or inverting interpolating stages comprises first and second buffers or inverters, and wherein the first buffer or inverter having an input coupled to the respective second ends of the first pair of capacitors.

14. The apparatus of claim 13, wherein the second buffer or inverter having an input coupled to the respective second ends of the second pair of capacitors.

15. The apparatus of claim 14, wherein respective outputs of the first and second buffers or inverters are electrically shorted.

16. The apparatus of claim 15, wherein the interpolator further comprises an amplifying stage coupled to the respective outputs of the first and second buffers or inverters, the amplifying stage having cross-coupled inverters.

17. A system comprising:
    a memory;
    a processor coupled to the memory, the processor including:
        a ring oscillator having odd number of delay stages to generate at least three non-quadrature phases; and
        an interpolator to receive the at least three non-quadrature phases from the ring oscillator, the interpolator to generate quadrature clock phases by interpolating the at least three non-quadrature phases; and
    a wireless interface for allowing the processor to communicatively couple to another device.

18. The system of claim 17 further comprises a display unit.

19. The system of claim 17, wherein the ring oscillator is a single-ended ring oscillator.

20. The system of claim 17, wherein the interpolator comprises
- an AC coupling interpolating stage for receiving the at least three phases; and
- a buffer or inverting interpolating stage coupled to the AC coupling interpolating stage.

* * * * *